US012306239B2

(12) United States Patent
Battut et al.

(10) Patent No.: US 12,306,239 B2
(45) Date of Patent: May 20, 2025

(54) DIAGNOSIS OF AN AIRCRAFT ENGINE CONTROL UNIT

(71) Applicant: SAFRAN AIRCRAFT ENGINES, Paris (FR)

(72) Inventors: Yvan Jean-Rene Battut, Moissy-Cramayel (FR); Gwenael Thierry Esteve, Moissy-Cramayel (FR); Mathieu Jean Jacques Santin, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 193 days.

(21) Appl. No.: 18/247,687

(22) PCT Filed: Oct. 5, 2021

(86) PCT No.: PCT/FR2021/051722
§ 371 (c)(1),
(2) Date: Apr. 3, 2023

(87) PCT Pub. No.: WO2022/074327
PCT Pub. Date: Apr. 14, 2022

(65) Prior Publication Data
US 2023/0408568 A1    Dec. 21, 2023

(30) Foreign Application Priority Data
Oct. 6, 2020   (FR) .................................... 2010195

(51) Int. Cl.
*G01R 31/00* (2006.01)
*G01M 15/14* (2006.01)

(52) U.S. Cl.
CPC .......... *G01R 31/008* (2013.01); *G01M 15/14* (2013.01)

(58) Field of Classification Search
CPC ...... G01R 31/52; G01R 31/54; G01R 31/008; G01M 15/14
See application file for complete search history.

(56) References Cited

U.S. PATENT DOCUMENTS

| 4,567,756 A * | 2/1986 | Colborn | G01R 31/006 |
| | | | 73/114.61 |
| 5,408,412 A * | 4/1995 | Hogg | G01M 15/05 |
| | | | 701/99 |

(Continued)

FOREIGN PATENT DOCUMENTS

| EP | 1079234 A1 | 2/2001 |
| FR | 3078791 A1 | 9/2019 |
| JP | 58-168936 A | 10/1983 |

OTHER PUBLICATIONS

International Search Report received for PCT Patent Application No. PCT/FR2021/051722, mailed on Dec. 8, 2021, 6 pages (2 pages of English Translation and 4 pages of Original Document).

*Primary Examiner* — Lee E Rodak
*Assistant Examiner* — Demetrius R Pretlow
(74) *Attorney, Agent, or Firm* — WOMBLE BOND DICKINSON (US) LLP (57) ABSTRACT

A device and a method for diagnosing an engine control unit of an aircraft, the device including an autonomous and mobile electronic diagnostic unit and connecting means for connecting the unit to an engine control unit of an aircraft, the connecting means advantageously including a single connection cable.

13 Claims, 6 Drawing Sheets

(56) References Cited

U.S. PATENT DOCUMENTS

| | | | | |
|---|---|---|---|---|
| 5,798,647 | A * | 8/1998 | Martin | G01R 31/007 |
| | | | | 73/114.61 |
| 6,442,498 | B1 | 8/2002 | Krigel | |
| 10,661,914 | B2 * | 5/2020 | Ziarno | G07C 5/0808 |
| 10,712,377 | B2 * | 7/2020 | Sybesma | B64F 5/60 |
| 2004/0104730 | A1 * | 6/2004 | Taylor | G01R 31/088 |
| | | | | 324/525 |
| 2007/0001683 | A1 * | 1/2007 | Krigel | G01R 31/58 |
| | | | | 324/538 |
| 2010/0268507 | A1 * | 10/2010 | Sorensen | G01R 31/58 |
| | | | | 702/120 |
| 2013/0162262 | A1 * | 6/2013 | Johnson | G01R 31/58 |
| | | | | 324/539 |

* cited by examiner

DIAGNOSIS OF AN AIRCRAFT ENGINE CONTROL UNIT

TECHNICAL FIELD OF THE INVENTION

The present invention relates to the diagnosis of an aircraft engine control unit, and in particular to the main control unit for regulating this engine.

TECHNICAL BACKGROUND

The technical background comprises in particular the documents FR-A1-3 078 791, U.S. Pat. No. 4,567,756, EP-A1-1 079 234, US-B1-6,442,498, and JP-A-S58 168936.

An aircraft engine, such as a turbomachine, is equipped with a control unit for regulating the engine. This main control unit of the engine, also known as the Digital Engine Control Unit (DECU), must be tested during regular maintenance operations to ensure that it is fully functional and free of faults. It can be likened to the brain of the engine and its proper functioning is essential to the operation and the operability of the engine of the aircraft.

During a maintenance operation on a control unit, a diagnosis is carried out. The purpose of diagnosis is to test the control unit in order to identify potential faults or failures.

In the prior art, there are several approaches to carry out this maintenance operation.

In a first approach, the diagnosis is carried out on a test bench. In practice, the control unit must be dismounted and removed from the engine and then installed on the test bench to test several functions of the control unit. A test bench is relatively heavy as it weighs several hundred kilograms and is also fragile. It is therefore not easily transportable and is usually kept in the workshop where the diagnosis is carried out. The test bench has several functions:
- it reproduces and simulates the behaviour of the engine and analyses the reactions and responses of the control unit, in order to validate its correct operation,
- it tests certain behaviours of the control unit in order to identify possible faults,
- etc.

In the second case, the faults may come from the control unit or from elements connected to this control unit, such as harnesses or items of equipment. The items of equipment are for example sensors or actuators.

One solution to make a diagnosis device lighter would be to limit its functions. For example, a device whose main function would be to detect certain faults of the control unit could be less bulky and lighter than a test bench of the type mentioned above.

However, the problem with such a diagnosis device would remain its electrical connection to the control unit and to the elements to be tested. Indeed, to carry out the tests, it would be necessary to connect the device to the control unit and to the elements which have numerous and different connectors. It would therefore be necessary to have several different connecting means and to plug and unplug the connectors according to the tests to be carried out, which would be long and tedious. In addition, the device would be equipped with many connecting ports and would therefore have to be oversized to have all these ports on one single face of the device, for example. The connecting means would connect the device to the control unit and to the items of equipment and would be so numerous that they could become intertwined and interfere with the maintenance operation.

In a second approach, the diagnosis is carried out by connecting a diagnosis tool in the cockpit of the aircraft, one engine of which is equipped with the control unit to be tested. The advantage of this approach is that the removal of the engine is not necessary. However, this approach has some disadvantages, particularly as it allows to identify a fault, but not to identify the source of the fault. Once a fault has been identified, it is therefore necessary to investigate the origin of the fault (of the control unit or of one of the elements connected to the control unit), knowing that the fault could be linked to an operating or communication problem between two elements. It is therefore necessary to carry out numerous tests to verify for possible faults, some tests requiring the removal and the replacement of an item of equipment with an equivalent one. The removal of one item of equipment is a complex operation because an item of equipment dismantled and tested must be rechecked before being reassembled on the aircraft. It may be that the dismantled and tested equipment is in fact fully functional. The identifying of the faults therefore involves the dismantling and the reassembling of a lot of items of equipment, which increases the risk of diagnosis errors and makes maintenance time-consuming and expensive. No Fault Found (NFF) is the term used to describe the situation where an element is dismantled from the engine while it is in good condition. The NFF rate should be as low as possible to reduce the time and cost of maintenance operations on the aircraft control units.

A final approach is to make manual measurements on elements of the engine hooked to the aircraft, but this approach does not allow to carry out an automatic diagnosis.

There is therefore a need to find a diagnosis solution that is simple to use and does not require the dismantling and removal of elements of the engine so that the maintenance operations of a control unit do not result in significant aircraft downtime.

SUMMARY OF THE INVENTION

According to a first aspect, the invention concerns a device for diagnosing an aircraft engine control unit, this device comprising:
- an electronic diagnosis unit, this unit being autonomous and mobile and being configured to carry out:
  - automatic continuity and/or electrical insulation tests of electrical connectors, and determining a health status of these connectors based on the test results, and/or
  - automatic tests for verifying the internal electrical integrity of a control unit without simulating the flight conditions of the engine to which the control unit is to be connected, and
- connecting means configured to connect the unit to a control unit of an aircraft engine, characterised in that the connecting means comprise a single connection cable which comprises at one end a first connecting plug for connection to the unit and at an opposite end a plurality of second connecting plugs for connection to the control unit and/or to elements of the aircraft engine intended to be connected to the unit.

In this application, the following definitions apply:
- an autonomous diagnosis unit, a unit configured to carry out tests on its own and to identify faults on the basis of the results of these tests, and thus to make a health status of the control unit and/or of the elements to which it is connected; this device is for example equipped with at least one power supply battery;

a mobile unit, a unit that is easily transportable by a user, i.e. the weight and the dimensions of which mean that the unit can be lifted and displaced by the user from a storage location to the aircraft base for maintenance purposes The invention thus proposes a single cable for connecting the device and the unit to the control unit, which simplifies and speeds up the maintenance operation of the control unit. There is no longer any risk of using the wrong connecting means or a connecting means equipped with the wrong plugs. In addition, having a single plug on one side of the cable allows to ensure that the cable is not cross-connected and therefore does not need to be reversed when plugging.

The same cable could be plugged to the unit when carrying out both types of test (continuity/insulation and integrity verification). Or a first single cable could be plugged to the unit when it carries out the continuity/insulation tests and a second single cable could be plugged to the same unit when it carries out the integrity verification tests. The cables would then advantageously be mechanically coded and/or could incorporate an internal electrical coding system which would be detected by the unit to carry out either test.

The device according to the invention may comprise one or more of the following characteristics, considered independently or in combination with each other:
  the cable comprises a first stretch with a single branch and a second stretch with a plurality of parallel branches, the branch of the first stretch being equipped with the first plug at its end opposite the second stretch, and the branches of the second stretch being equipped with the second plugs at their ends opposite the first stretch;
  the first stretch has a length L1 and the second stretch has a maximum length L2, L1>k.L2 with k at least equal to 1 and preferably at least equal to 2;
  at least some of the branches of the second stretch have different lengths;
  the device further comprises a portable computer system, the unit and this computer system being configured to communicate by wireless link;
  the second plugs of the cable comprise plugs that are configured to be connected to ports of the control unit, and other plugs that are configured to be connected to complementary plugs of harnesses or items of equipment of the aircraft engine;
  the unit is configured to measure electrical impedance values, to compare measured values with theoretical values pre-stored in the unit, and to emit a signal in accordance with the results of the comparison;
  the unit comprises a signal and/or data generation module, a signal and/or data acquisition module, at least one signal and/or data storage memory, a signal and/or data processing module and a signal and/or data communication module, etc.;
  the unit is in the form of a suitcase with a closing lid and at least one carrying handle.

The present invention also relates to a use of a device as described above for diagnosing a control unit of an engine which is hooked to an aircraft.

Preferably, the engine is a propulsion assembly equipped with a nacelle and the control unit is located in the nacelle.

Preferably, the control unit is a FADEC3 or a DECU.

According to a second aspect, the invention relates to a method for diagnosing an aircraft engine control unit, by means of a diagnosis device comprising:
  an electronic diagnosis unit, this unit being autonomous and mobile and configured to carry out automatic continuity and/or electrical insulation tests of electrical connectors, and to determine a health status of these connectors based on the results of the tests, and
  connecting means configured to connect the unit to a control unit of an aircraft engine,
  characterised in that the method is carried out while the engine is hooked to the aircraft and comprises the steps of:
  disconnecting at least one harness connecting the control unit to items of equipment,
  plugging the connecting means to the unit on the one hand and to the harness and the items of equipment on the other, and
  analysing the health status of the harness and the items of equipment by carrying out automatic continuity and/or electrical insulation tests on electrical connectors on the harness and the items of equipment.

The method therefore allows to verify the health status of the harnesses and the items of equipment, such as the actuators and the sensors, connected to the control unit. This verification is carried out by testing electrical continuity and electrical insulation of connectors. For example, one strand of an electrical harness beam is connected at its ends to connectors and must ensure an electrical continuity between these connectors. An electrical continuity test between these connectors should allow to verify that the continuity is not broken or interrupted. Furthermore, one strand of this beam must be electrically isolated from another strand of this beam. Connectors connected at the ends of these strands must therefore be electrically insulated from each other. An electrical insulation test between these connectors should allow to verify this insulation and therefore the absence of short circuits between the strands.

The method according to the invention may comprise one or more of the following characteristics and/or steps, considered independently or in combination with each other:
  the items of equipment comprise actuators and/or sensors;
  each of the tests consists of measuring an impedance value, comparing this measured value with a theoretical value pre-stored in the unit, and emitting a signal according to the results of the comparison;
  the continuity tests are carried out by plugging the connecting means to a single port on the unit and to plugs on the harness and the items of equipment;
  the insulation tests are carried out by plugging the connecting means to a single port on the unit and to plugs on the harness and the items of equipment, these connecting means comprising a ground socket connected to a metal casing of the engine;
  the connecting means comprise a single connection cable which comprises at one end a first connecting plug for connection to the unit and at an opposite end a plurality of second connecting plugs for connection to the harness and the items of equipment.

According to a third aspect, the invention relates to a method for diagnosing an aircraft engine control unit, by means of a diagnosis device comprising:
  an electronic diagnosis unit, this unit being autonomous and mobile and configured to carry out automatic tests to verify the internal electrical integrity of a control unit without simulating the flight conditions of the engine to which the control unit is connected,
  connecting means configured to connect the unit to a control unit of an aircraft engine,
  characterised in that the method is carried out while the engine is hooked to the aircraft and comprises the steps of:

disconnecting at least one harness connecting the control unit to items of equipment, plugging the connecting means to the unit on the one hand and to the control unit on the other hand, and analysing the internal electrical integrity of the control unit by carrying out automatic tests comprising:

the transmission by the unit to the control unit, through the connecting means, of adjustment parameters in internal memories of the control unit, the reception by the unit of the responses of the control unit, through the connecting means, and analysis of these responses to deduce the health status of the control unit.

In order to significantly reduce the NFF rate, it is necessary to carry out a diagnosis of the control unit before removing it, as is currently the case.

The principle is not to read the self-test faults or to read the faults that have come up during operation, but to specifically excite the control unit in order to compare its operation with a model. If its operation deviates from the model then it is declared non-functional.

To verify the presence of a fault in the incriminated control unit, the unit will allow internal verifications to be made on the control unit by processing to the excitation of the inputs and outputs of the control unit by passing adjustment parameters into the internal memories of the control unit, and internal measurements which will verify the responses according to the excitations.

Depending on the excitations performed internally in the control unit by the invention, the unit will then verify that the returns are in accordance with the expected.

The invention therefore does not electrically simulate all the sensors and actuators but intervenes directly in the control unit to verify the integrity of its operation as closely as possible to the control unit. This allows the device to be less bulky and therefore mobile to be transported as close as possible to an engine and to be able to carry out a maintenance operation directly on the control unit of an engine hooked to the aircraft.

The method according to the invention may comprise one or more of the following characteristics and/or steps, considered independently or in combination with each other:

the disconnection step comprises disconnecting at least a first harness connecting the control unit to items of equipment and a second harness connecting the control unit to the engine, said at least one first harness being connected to input ports of the control unit and said second harness being connected to at least one output port of the control unit;

the plugging step comprises plugging the connecting means to said input ports and said at least one output port of the control unit;

the tests comprise two distinct verification phases, a first phase for verifying the electrical integrity of the control unit via the input ports, and a second phase for verifying the electrical integrity of the control unit via said at least one output port;

the first phase comprises the transmission of adjustment parameters to the control unit via the input ports, and the measurement of signals generated directly in the internal memories of the control unit and in a software interfacing between the operating system and the application software package of the control unit;

the second phase comprises the transmission of the adjustment parameters to the control unit via said at least one output port, and the measurement of signals generated directly in the internal memories of the control unit and in a software interfacing between the operating system and the application software package of the control unit;

the method comprises, during the tests, a step of transmission by the unit to the control unit, through the connecting means, of physical quantities intended to inhibit the appearance of a false fault in the memories of the control unit;

the connecting means comprise a single connection cable which comprises at one end a first connecting plug for connection to the unit and at an opposite end several second connecting plugs for connection to the control unit;

said memories of the control unit are RAM memories (Random Access Memory) which are volatile working memories of the control unit and are not NVM memories (Non Volatile Memory) which are storage memories of the certified software of engine regulation; this allows not to disturb the memories of the certified software OS/AS of engine control, which could generate false faults during the tests.

BRIEF DESCRIPTION OF THE FIGURES

Further characteristics and advantages of the invention will become apparent from the following detailed description, for the understanding of which reference is made to the attached drawings in which.

DETAILED DESCRIPTION OF THE INVENTION

Figure 1:
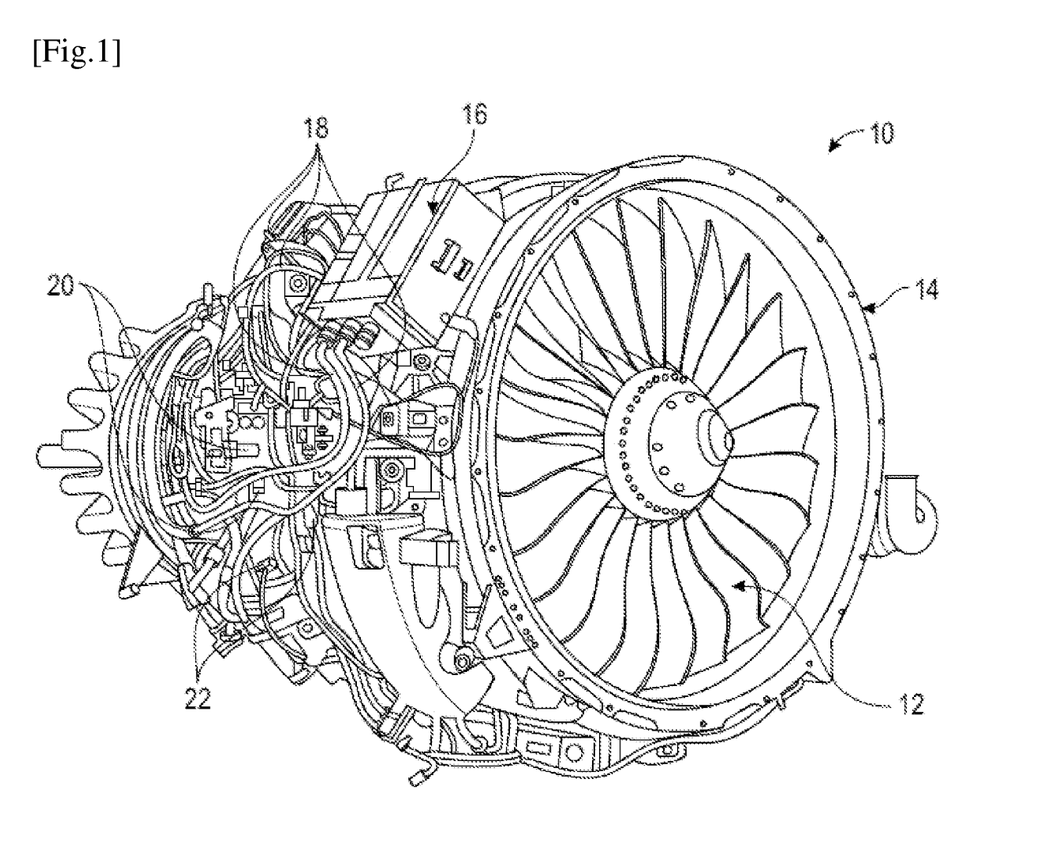
FIG. 1 is a schematic perspective view of an aircraft engine equipped with a control unit.

FIG. 1 is a schematic perspective view of an engine 10 for an aircraft. In the example shown, this is a turbomachine, more precisely a turbofan engine. This engine 10 is intended to be equipped to an aircraft and may be attached under a wing of the aircraft or at the rear of the fuselage of the aircraft.

Essentially, the engine 10 comprises a gas generator that comprises at least one compressor, an annular combustion chamber and at least one turbine. A propeller referred to as fan 12 is located upstream of the gas generator, with reference to the flowing of the gases in the engine 10, and is surrounded by a casing 14. This casing 14 defines an annular inlet duct for an air flow passing through the fan 12, a portion of which is intended to flow around the gas generator, and a portion of which is intended to feed the gas generator. This other portion of the air flow is compressed in the compressor, mixed with fuel and burned in the combustion chamber, and then expanded in the turbine to drive in rotation its rotor as well as the rotor of the compressor and the fan 12.

The engine 10 and in particular the casing 14 are intended to be surrounded by a nacelle not shown, this nacelle defining around the casing 14 an annular space for mounting several members.

Amongst these members, it includes the regulation control unit 16 of the engine 10, which is the main control unit of the engine and can be considered the brain of the engine 10. This control unit, of the DECU (Digital Engine Control Unit) or FADEC (Full Authority Digital Engine Control) type, has several functions such as:
- regulating the fuel feed flow rate to the combustion chamber,
- automatic starting of the engine,
- transmitting engine parameters to the instruments of the cockpit of the aircraft,
- managing the thrust and protecting operational limits,
- managing reverse thrust,
- etc.

The control unit 16 is connected via electrical harnesses 18 to a number of items of equipment in the engine 10, such as actuators 20 and sensors 22. The actuators 20 are for example control actuators of variable pitch vanes of the compressor, discharge gate control actuators, actuators of a thrust reverser, etc. The sensors 22 are for example temperature sensors, pressure sensors, position sensors, etc.

Figure 2:
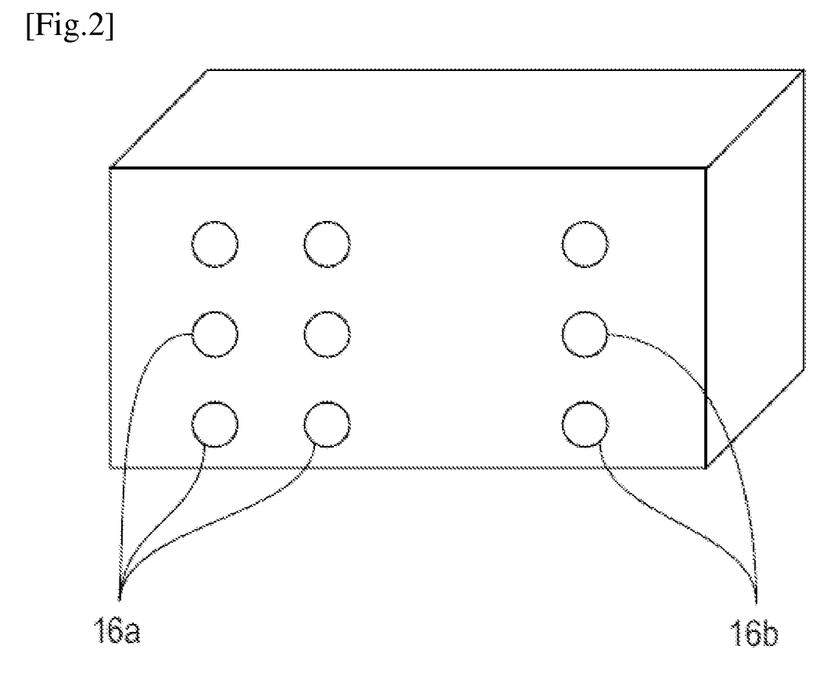
FIG. 2 is a very schematic perspective view of a regulation control unit of an aircraft engine.

As schematically shown in FIG. 2, a control unit 16 is, for example, generally parallelepipedic in shape and comprises electrical input ports 16a and electrical output ports 16b. These ports 16a, 16b are connected to the aforementioned items of equipment by the harnesses 18, which comprise at their ends connecting plugs for connection to the ports 16a, 16b on the one hand, and to the items of equipment on the other.

As mentioned above, a control unit 16 of this type needs regular maintenance to verify its health status and therefore its proper functioning.

The present invention relates to a diagnosis device and a method for diagnosing a control unit 16, the diagnosis having the advantage of being carried out without prior disassembly of the control unit 16 which is therefore intended to remain on the engine 10.

In practice, it is therefore understood that an operator only needs to dismantle the nacelle or at least a cover of this nacelle to have access to the control unit 16 and proceed to the maintenance operation and the diagnosis of the control unit 16. This operation can be done directly under the wing or at the rear of the fuselage of the aircraft, which is particularly advantageous as it limits the time the aircraft is on the ground.

Figure 3:
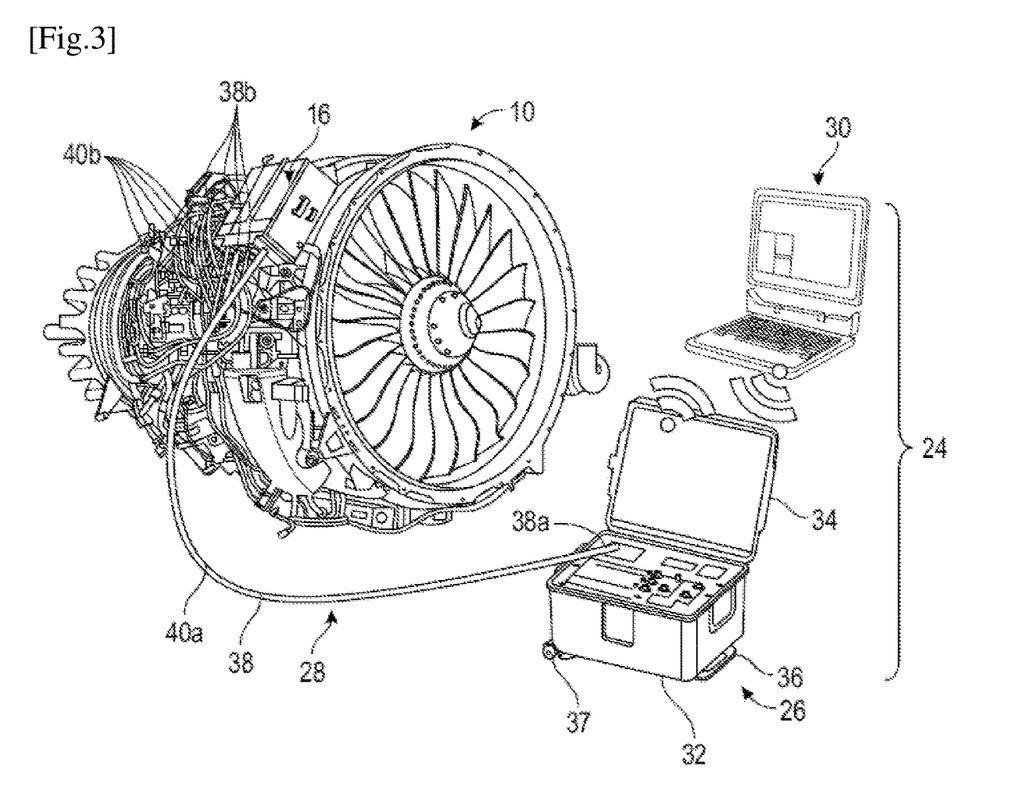
FIG. 3 is a schematic perspective view of the engine of FIG. 1 and a diagnosis device according to the invention.

FIG. 3 shows a method for diagnosing the control unit 16 by means of a diagnosis device 24 according to the invention.

This device 24 comprises an electronic diagnosis unit 26, means 28 for connection to the unit 26 to the control unit 16, and optionally a portable computer system 30.

The system 30 is, for example, a computer, a tablet or a phone of the smartphone type, and is advantageously configured to communicate by wireless link (for example via a WIFI network) with the unit 26.

The system 30 may comprise a software or an application for controlling the unit 26 in order to carry out automatic tests, and a screen for displaying the results of these tests.

The unit 26 is autonomous and mobile and is configured to carry out:

- automatic continuity and/or electrical insulation tests of electrical connectors, and determining a health status of these connectors based on the test results, and/or
- automatic tests to verify the internal electrical integrity of the control unit 16 without simulation of this control unit.

In the example shown, the unit 26 is in the form of a suitcase 32 with a closing lid 34 and at least one carrying handle 36, and possibly also wheels 37.

The unit 26 comprises a signal generation module, a signal acquisition module, a data generation module, a data acquisition module, at least one data storage memory, a data processing module and a data communication module, etc.

In a preferred embodiment of the invention, the unit 26 is configured to measure electrical impedance values, to compare measured values with theoretical values pre-stored in the unit, and to emit a signal based on the results of the comparison.

As shown in FIG. 3, the connecting means comprise a single connecting cable 38 which comprises at one end a first connecting plug 38a for connection to the unit 26 and at an opposite end a plurality of second connecting plugs 38b for connection to the control unit 16 and/or to elements of the engine 10 intended to be connected to the unit 26.

In the example shown, the cable 38 comprises a first stretch 40a with a single branch and a second stretch 40b with a plurality of parallel branches 40b1, 40b2, etc., 40n, the branch of the first stretch 40a being equipped with the first plug 38a at its end opposite the second stretch 40b, and the branches 40b1, 40b2, etc., 40n of the second stretch 40b being equipped with the second plugs 38b at their ends opposite the first stretch 40a.

Figure 4:
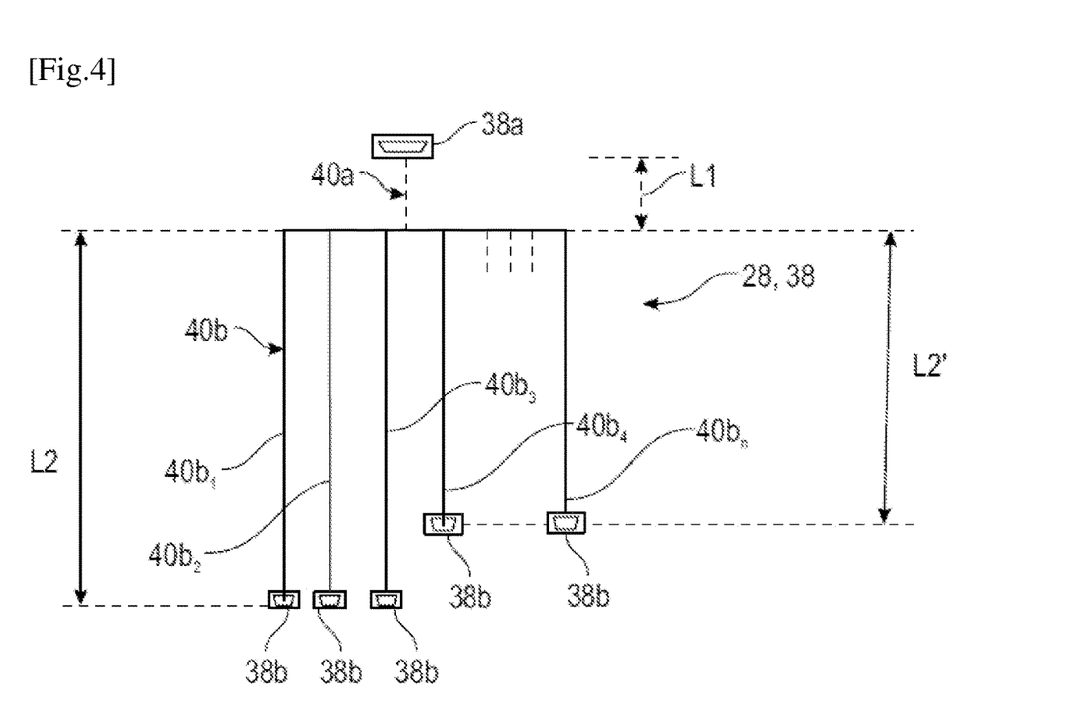
FIG. 4 is a very schematic view of a cable connecting the diagnosis device to the control unit.

FIG. 4 is a schematic view of the cable 38 and shows the connecting plug 38a for connection to the unit 26, and the connecting plugs 38b for connection to the control unit 16 and to the various elements formed by the harnesses 18 and the items of equipment (actuators 20 and sensors 22).

The first stretch 40a has a length L1 and the second stretch 40b has a maximum length L2. Preferably $L1 > k \cdot L2$ with k at least equal to 1 and preferably at least equal to 2. In other words, the length of the first stretch 40a is greater than that of the second stretch 40b, as can be seen in FIG. 3. Furthermore, advantageously, at least some of the branches 40b1, 40b2, etc., 40n of the second stretch 40b have different lengths L2, L2'. These differences in length between the stretches and the branches of the cable 38 allow to make it easier to handle the cable and limit the risk of incorrect plugging. In particular, the differences in length of the branches 40b1, 40b2, etc., 40n are calculated according to the positions of the input and output ports 16a, 16b of the control unit 16 and according to the items of equipment to which the control unit is to be connected so as to ensure an error-proofing during these connections.

One of the functionalities of the device 24 may be to carry out automatic continuity and/or electrical insulation tests of electrical connectors, and to determine the health status of those connectors based on the results of the tests.

In this case, the diagnosis method comprises the steps of:
- disconnecting at least one harness 18 connecting the control unit 16 to items of equipment,
- plugging of the connecting means 28 to the unit 26 on the one hand and to the harness 22 and/or items of equipment on the other hand, and
- analysing the health status of the harness 22 and/or items of equipment by carrying out automatic continuity and/or electrical insulation tests on electrical connectors of the harness and/or items of equipment.

In a preferred embodiment, each of the tests involves measuring an impedance value, comparing this measured value with a theoretical value pre-stored in the unit, and emitting a signal based on the results of the comparison.

Figure 5:
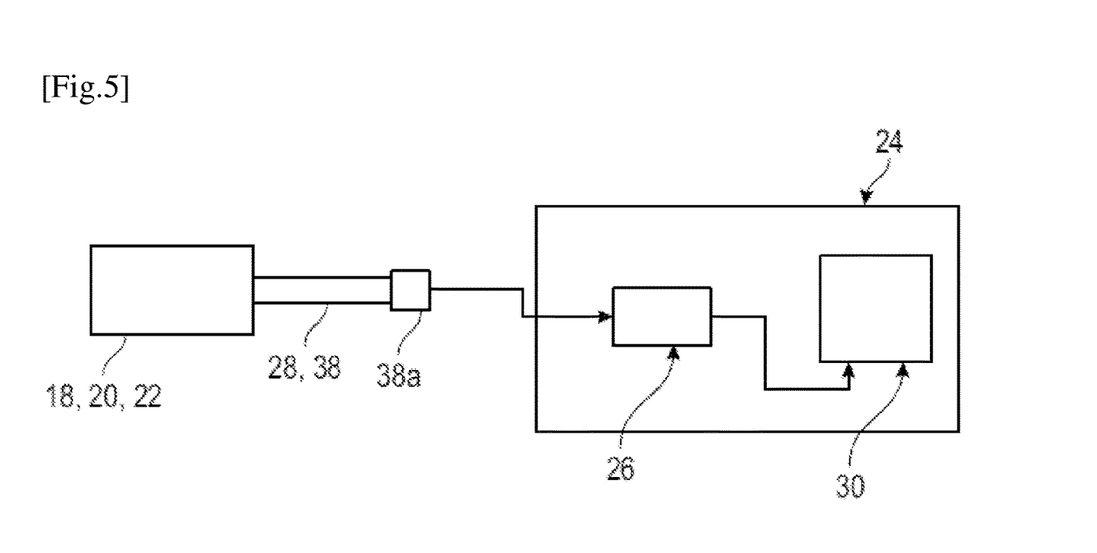
FIG. 5 is a very schematic view illustrating a step of a diagnosis method according to the invention.

The continuity tests are carried out by plugging the connecting means 28 to the single port of the unit 26 and to plugs of the harness 22 and/or the equipment (actuators 20 and sensors 22), as schematically shown in FIG. 5.

The tests are carried out automatically by carrying out an automatically switching between the different electrical connectors of the harnesses/sensors/actuators to be tested for continuity. This switching is programmed and the measurements made are impedances that must return in accordance with tables of theoretical values programmed according to what is being tested.

In this way, the unit tests all the connectors that normally come from the harnesses/sensors/actuators that plug into the control unit by connecting them to this unit instead.

As the measurements are then automated, they take only a few seconds per measurement without the risk of false handling that can distort the measurement as when it is done manually today with a multimetre and an aircraft mechanic.

The invention therefore allows to eliminate the possibility of false handling, increases the reliability of the measurement and also speeds up the process by automating the measurements once the harnesses/sensors/actuators are connected to the unit by the connecting means.

The measured continuity is in fact an impedance which translates into voltage, current and/or resistance measurements in the unit.

Figure 6:
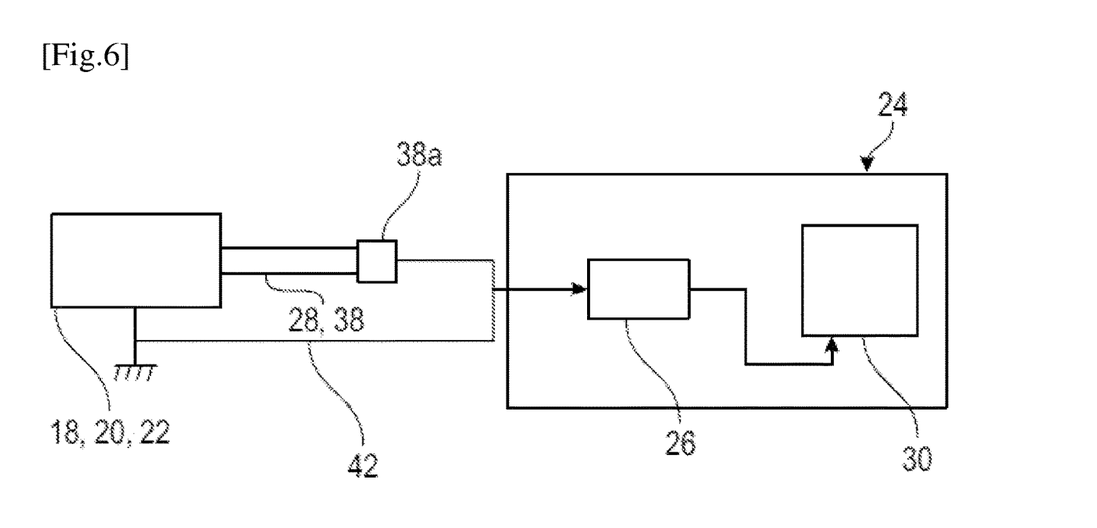
FIG. 6 is a very schematic view illustrating a further step of a diagnosis method according to the invention.

As schematically shown in FIG. 6, the insulation tests are carried out by plugging the connecting means 28 to the single port of the unit 26 and to plugs of the harness 22 and/or items of equipment (actuators 20 and sensors 22), these connecting means 28 comprising a ground socket 42 connected to a metal casing of the engine, such as the aforementioned casing 14.

In the same way as above for each continuity test, each insulation test is also carried out as could be done manually and pin by pin on each of the equipment connectors and/or harnesses connected to the control unit but the invention proposes to do this directly and automatically.

The unit then automatically carries out a switching between the different electrical connectors of the harnesses/sensors/actuators whose insulation is to be tested. This switching is programmed into the unit and the measurements made are impedances that must return in accordance with tables of theoretical values programmed according to what is being tested.

In theory, infinite impedances in Ohms are expected for insulation. In practice, finite and very large programmed values that depend on the measurement are programmed into the unit on a case-by-case basis.

In this way, the unit tests all the connectors that normally come from the sensors/actuators that plug into the control unit by connecting them to this unit instead.

As the measurements are then automated, they take only a few seconds per measurement without the risk of false handling that can distort the measurement as when it is done manually today with a multimetre and an aircraft mechanic.

The invention therefore allows to eliminate the possibility of false handling, increases the reliability of the measurement and also speeds up the process by automating the measurements once the harnesses/sensors/actuators are connected to the unit by the connecting means.

The insulation is the translation of a circuit with a high impedance compared to a preset compliance table for each test case.

One of the functionalities of the device 24 may be to carry out automatic tests to verify the internal electrical integrity of the control unit 16 without simulating the control unit.

In this case, the diagnosis method comprises the steps of:
disconnecting at least one harness connecting the control unit to items of equipment,
plugging the connecting means to the unit on the one hand and to the control unit on the other hand, and
analysing the internal electrical integrity of the control unit by carrying out automatic tests comprising:
the transmission by the unit to the control unit, through the connecting means, of adjustment parameters in internal memories of the control unit,
the reception by the unit of the responses of the control unit, through the connecting means, and analysis of these responses to deduce the health status of the control unit.

Advantageously, the disconnection step comprises disconnecting at least one first harness connecting the control unit to items of equipment and a second harness connecting the control unit to the engine, said at least one first harness being connected to input ports of the control unit and said second harness being connected to at least one output port of the control unit.

The plugging step preferably comprises the plugging of the connecting means to said input ports and said at least one output port of the control unit.

According to a preferred embodiment of the invention, the tests comprise two distinct verification phases, a first phase for verifying the electrical integrity of the control unit via the input ports, and a second phase for verifying the electrical integrity of the control unit via said at least one output port.

Figure 7:
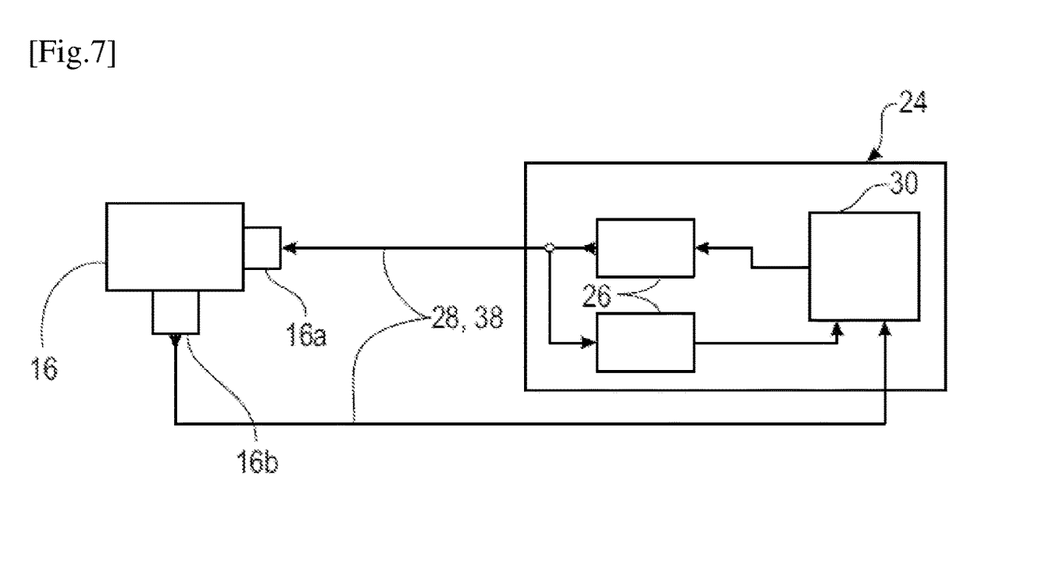
FIG. 7 is a very schematic view illustrating a further step of a diagnosis method according to the invention.

As illustrated in FIG. 7, the first phase comprises, the transmission of adjustment parameters to the control unit 16 via the input ports 16a, and the measurement of signals generated directly in the internal memories of the control unit and in a software interfacing between the operating system and the application software package of the control unit.

The unit injects defined signals via the cable to simulate physical quantities of the sensors/actuators to be tested and verifies that the expected regulation functions according to the simulated inputs are in accordance with those expected.

The measurements performed in the control unit are made internally at the level of the internal loops of the signals. These tests use the simulation of the external portions connected to the control unit, but the measurements are performed internally by internal loop of the measurements directly to the memory registers and the software interfacing between the operating system and the application software package of the control unit. This gives a true internal operating (or malfunctioning) status of the control unit.

In addition, in order not to create false faults in the memories of the control unit, a false fault inhibition can be caused by the current/voltage/impedance scan of the physical quantities expected by the control unit. This allows to restore the control unit to the same state as before the test.

Figure 8:
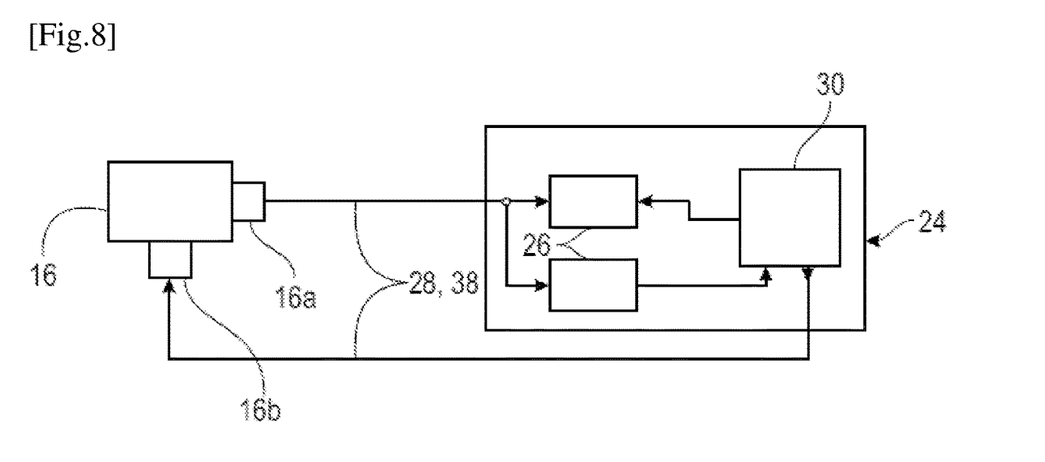
FIG. 8 is a very schematic view illustrating a further step of a diagnosis method according to the invention.

As illustrated in FIG. 8, the second phase comprises, transmitting the adjustment parameters to the control unit via said at least one output port, and measuring signals generated directly in the internal memories of the control unit and in a software interfacing between the operating system and the application software package of the control unit.

The tests of the outputs use the same principle as the tests of the inputs.

The unit injects defined signals via the cable to simulate physical quantities of the sensors/actuators to be tested and verifies that the expected regulation functions according to the simulated outputs are in accordance with those expected.

The measurements performed in the control unit are made internally at the level of the internal loops of the signals. These tests use the simulation of the external portions connected to the control unit, but the measurements are performed internally by internal loop of the measurements directly to the memory registers and the software interfacing between the operating system and the application software package of the control unit. This gives a true internal operating (or malfunctioning) status of the control unit.

In addition, in order not to create false faults in the memories of the control unit, a false fault inhibition can be caused by the current/voltage/impedance scan of the physical quantities expected by the control unit. This allows to restore the control unit to the same state as before the test.

The invention claimed is:

1. A device for diagnosing an aircraft engine control unit comprising:
    an electronic diagnosis unit, said electronic diagnosis unit being autonomous and mobile and being configured to carry out:
        automatic continuity and/or electrical insulation tests of electrical connectors, and determining a health status of these connectors based on the results of the tests, and/or
        automatic tests for verifying the internal electrical integrity of the aircraft engine control unit without simulating the flight conditions of the engine to which the aircraft engine control unit is to be connected, and
    connecting means configured to connect the electronic diagnosis unit to the aircraft engine control unit of an aircraft engine,
    wherein the connecting means comprise a single connection cable which comprises:
    a first cable portion including at a free end a first connecting plug for connection to the electronic diagnosis unit, and
    a second cable portion connected to the first cable portion and including at second free ends a plurality of second connecting plugs for connection to the aircraft engine control unit and/or to elements of the aircraft engine intended to be connected to the aircraft engine unit.

2. The device according to claim 1, wherein the cable is constituted by a first stretch with a single branch and by a second stretch with a plurality of parallel branches, the branch of the first stretch being equipped with the first connecting plug at its end opposite the second stretch, and the branches of the second stretch being equipped with the second connecting plugs at their ends opposite the first stretch.

3. The device according to claim 2, wherein the first stretch has a length L1 and the second stretch has a maximum length L2, L1 being equal to L1 or greater than L2.

4. The device according to claim 2, wherein at least some of the branches of the second stretch have different lengths.

5. The device according to claim 1, wherein said device further comprises a portable computer system, the electronic diagnosis unit and and said computer system is configured to communicate by a wireless link.

6. The device according to claim 1, wherein the second plugs of the cable comprise plugs that are configured to be connected to ports of the aircraft engine control unit, and other plugs that are configured to be connected to complementary plugs of harnesses or items of equipment of the aircraft engine.

7. The device according to claim 1, wherein the electronic diagnosis unit is configured to measure electrical impedance values, to compare measured values with theoretical values pre-stored in the electronic diagnosis unit, and to emit a signal in accordance with the results of the comparison.

8. The device according to claim 1, wherein the electronic diagnosis unit comprises a signal and/or data generation module, a signal and/or data acquisition module, at least one signal and/or data storage memory, a signal and/or data processing module and a signal and/or data communication module.

9. The device according to claim 1, wherein the electronic diagnosis unit is in the form of a suitcase with a closing lid and at least one carrying handle.

10. A method for diagnosing an aircraft engine control unit by means of a device according to claim 1, wherein said method comprises a step of connecting the single connection cable to the electronic diagnosis unit, to the aircraft engine control unit and/or to the elements of the aircraft engine which is hooked to an aircraft.

11. The method according to claim 10, wherein the step of connecting to the aircraft engine control unit is performed in a nacelle of the aircraft engine where the aircraft engine control unit is located.

12. The method according to claim 10, wherein the aircraft engine control unit is an electronic control unit.

13. The device according to claim 3, wherein $L1>k*L2$ with a scaling factor k which is at least equal to 2.

* * * * *